(12) United States Patent
Kim

(10) Patent No.: US 10,554,009 B2
(45) Date of Patent: Feb. 4, 2020

(54) HIGHLY EFFICIENT LASER IGNITION DEVICE

(71) Applicants: Nam Seong Kim, Anyang-si (KR); FIBERO INC., Gunpo-si (KR)

(72) Inventor: Nam Seong Kim, Anyang-si (KR)

(73) Assignees: Nam Seong Kim (KR); FIBERO INC. (KR)

( * ) Notice: Subject to any disclaimer, the term of this patent is extended or adjusted under 35 U.S.C. 154(b) by 0 days.

(21) Appl. No.: 15/543,667

(22) PCT Filed: Jan. 12, 2016

(86) PCT No.: PCT/KR2016/000263
§ 371 (c)(1),
(2) Date: Jul. 14, 2017

(87) PCT Pub. No.: WO2016/117870
PCT Pub. Date: Jul. 28, 2016

(65) Prior Publication Data
US 2018/0013257 A1    Jan. 11, 2018

(30) Foreign Application Priority Data
Jan. 20, 2015  (KR) .......... 10-2015-0009263

(51) Int. Cl.
*H01S 3/0941* (2006.01)
*F02P 23/04* (2006.01)
(Continued)

(52) U.S. Cl.
CPC ............ *H01S 3/0941* (2013.01); *F02P 23/04* (2013.01); *H01S 3/094053* (2013.01);
(Continued)

(58) Field of Classification Search
CPC . H01S 3/094053; H01S 3/0941–09415; H01S 3/113; H01S 3/1115–1118;
(Continued)

(56) References Cited

U.S. PATENT DOCUMENTS 8,824,519 B1 * 9/2014 Seurin ............... H01S 3/094053
372/50.124
8,948,222 B1 * 2/2015 Venables ............. H01S 5/06213
372/29.01
(Continued)

FOREIGN PATENT DOCUMENTS

DE    102015214511 A1 * 2/2016  .......... H01S 5/4025
EP      3211735 A1 * 8/2017  .......... G02B 27/123
(Continued)

OTHER PUBLICATIONS

International Search Report for PCT/KR2016/000263; 2 pgs.

*Primary Examiner* — Joshua King
(74) *Attorney, Agent, or Firm* — Schmeiser, Olsen & Watts, LLP

(57) ABSTRACT

A highly efficient laser ignition device is provided. The highly efficient laser ignition device fundamentally includes: a pumping light source adopting a multi-chip single emitter-packaged optical fiber output laser diode; a laser medium to which ytterbium is added; and a saturated absorber as a passive Q-switch medium, wherein a pulse of 100-999 ps as the passive Q-switch laser output can be obtained. According to the disclosed, the problems of high cost/low efficiency/low reliance/non-uniformity, which are disadvantages for replacing an ignition device using an electric spark with a laser ignition device, can be solved.

4 Claims, 3 Drawing Sheets

(51) Int. Cl.
*H01S 3/113* (2006.01)
*H01S 3/094* (2006.01)
*H01S 3/11* (2006.01)
*H01S 3/16* (2006.01)
*H01S 5/022* (2006.01)

(52) U.S. Cl.
CPC ............. *H01S 3/113* (2013.01); *H01S 3/1115* (2013.01); *H01S 3/1618* (2013.01); *H01S 3/1623* (2013.01); *H01S 3/1643* (2013.01); *H01S 3/09415* (2013.01); *H01S 3/094038* (2013.01); *H01S 5/02284* (2013.01)

(58) Field of Classification Search
CPC .. H01S 3/0627; H01S 5/4012; H01S 5/02284; H01S 3/2383; H01S 3/094038; F02P 23/04; F02P 15/08
See application file for complete search history.

(56) References Cited

U.S. PATENT DOCUMENTS

| | | | |
|---|---|---|---|
| 9,397,469 B1 * | 7/2016 | Nijjar | H01S 3/042 |
| 2003/0039274 A1 * | 2/2003 | Neev | H01S 3/0627 372/10 |
| 2009/0296750 A1 * | 12/2009 | Ridderbusch | F02P 23/04 372/14 |
| 2011/0150026 A1 * | 6/2011 | Tsunekane | F02P 23/04 372/75 |
| 2012/0105968 A1 * | 5/2012 | Chann | G02B 27/0905 359/634 |
| 2013/0186362 A1 * | 7/2013 | Kanehara | F02P 15/08 123/143 B |
| 2013/0255613 A1 * | 10/2013 | Hartke | F02P 23/04 123/143 B |
| 2013/0291818 A1 | 11/2013 | Hartke | |
| 2016/0036194 A1 * | 2/2016 | Sato | B23K 26/0624 359/345 |

FOREIGN PATENT DOCUMENTS

| | | | | |
|---|---|---|---|---|
| JP | 1981060861 | A | 5/1981 | |
| JP | 2001358394 | A | 12/2001 | |
| JP | 2006144618 | A | 6/2006 | |
| JP | 2006329186 | A | 12/2006 | |
| JP | 2010014030 | A | 1/2010 | |
| JP | 2014150222 | A | 8/2014 | |
| JP | 2014192166 | A * | 10/2014 | ............ F02P 23/04 |
| KR | 20010017113 | A | 3/2001 | |
| WO | WO-2015133533 | A1 * | 9/2015 | ........... G02B 6/4296 |

* cited by examiner

HIGHLY EFFICIENT LASER IGNITION DEVICE

CROSS-REFERENCE TO RELATED APPLICATIONS

This application claims priority to PCT Application No. PCT/KR2016/000263 having a filing date of Jan. 12, 2016, based off of KR 10-2015-0009263 having a filing date of Jan. 20, 2015, the entire contents of which are hereby incorporated by reference.

FIELD OF TECHNOLOGY

The following relates to a laser ignition device used for igniting an internal combustion engine of a vehicle or the like, and more particularly, to a laser ignition device in which a pumping light source, a laser medium, a saturable absorber, an emission cross section, and the like are improved to realize a low cost, miniaturization, high efficiency thereof.

BACKGROUND

Engine ignition devices used for the longest time are electric spark ignition devices in which positive and negative electrodes are installed to maintain suitable intervals and high voltage electric discharge pulses are generated to ignite fuel in engines. Since such a spark ignition electrode device has a disadvantage in that its design makes it difficult to uniformly ignite to the utmost in an entire internal space of an engine, the spark ignition electrode device has a slightly lower fuel efficiency in the range of 16 to 18%. Since the 1990s, various types of laser ignition devices have been suggested to realize uniform discharge and to improve an ignition efficiency which is a problem of the spark ignition device. Although British and Japanese research teams suggested a laser ignition system and demonstrated that an engine efficiency in the range of 22 to 24%, which is improved by about 6% compared to an electric discharge method, can be realized, the laser ignition system still has low efficiency or lacks the specificity and economic feasibility needed to be actually applied to a vehicle engine, and thus commercialization has not yet been achieved. The main reason for this is that high cost pumping laser diodes are used, and thus actual application was almost impossible. As a specific example, for a conventional laser ignition device, research and development has been progressed in a method in which a laser medium to which mainly neodymium (Nd) is added is used, but a Nd-based laser medium, which is core laser technology, has a disadvantage in that an optimum pumping time thereof is in the range of 200 to 300 µs or less, and thus only an energy of a pumping laser diode pulse corresponding to a maximum of 300 µs per pulse can be used. In this case, the cost of a pumping laser diode, in which a usable pumping wavelength band is 800 nm and a required average output is 100 W or more, is four to five thousand dollars or more, and thus pumping laser diode is an optical component with a cost that is almost impossible to lower. Meanwhile, in 2012, a Japanese research team suggested a new laser ignition system in which laser pulse output light having a 1064 nm wavelength and generated by pulse-pumping the Nd-based laser medium with a laser diode having an 808 nm pumping wavelength is focused at high intensity on a very small diameter by a lens to generate light emission pulses to ignite fuel. However, the commercialization of such a system at low cost is estimated to be almost impossible even when a vertical-cavity surface emitting laser diode (VCSEL), which is a mass production type, is used.

Since a laser discharge system using such an Nd-based laser has an Nd ion having a short upper-state lifetime of 170 µs, a pumping pulse width of a pumping laser diode having a similar pulse width also has to be maintained in the range of about 200 to 300 µs, and even when a high cost 120 W pumping laser diode is used, only a pumping pulse energy in the range of 24 to 36 mJ per pulse can be input to the laser medium. As described above, the laser discharge system using an Nd laser has problems in that (1) a high cost 808 nm pumping laser diode has to be used, (2) since an upper-state lifetime of an Nd ion is 170 µs, an efficiency thereof is maximized when a pumping pulse width is about 300 µs at maximum, and thus a maximally usable pumping pulse energy is small and inefficient, (3) since the peak power of the pumping laser diode is high, a high current is used as an input power, and thus a driving circuit is complex, (4) accordingly, the entire system becomes expensive, and thus there is a problem in that actual application becomes almost impossible. (5) In addition, since there is a high possibility that combustion by-products, which are a problem when the system is actually applied and are generated during the combustion of fuel, adhere to a laser beam emission window, and an automatic cleaning function for a window inside a combustion chamber is not included, actual application is almost impossible. (6) Although there is a design in which an optical component having a high refractive index is applied for multi-focal combustion, when oscillation directions of output laser beams of multiple laser resonators are finely changed per pulse or beam divergence angles are changed, there is a high possibility that an output energy of the laser beams transmitted to a focal point in the combustion chamber through a focal lens is changed, and thus there is a possibility that incomplete ignition or ignition failure occurs.

Meanwhile, heat having a high temperature of about 2,000° C. is generated around an ignition point during an explosion stroke (expansion stroke) in an engine. Accordingly, there is a concern that the heat, which adversely affects the laser ignition device, can be transferred to the laser ignition device due to an emission spectrum, and thus there is a problem of insufficient preparation therefor in an ignition device of the conventional technology.

SUMMARY

An aspect relates to a highly efficient laser ignition device in which low costs and small type packaging are realized, which has been difficult up to now.

In addition, embodiments of the present invention is also directed to providing a highly efficient laser ignition device in which the maximum usable pumping pulse energy is increased, a low current is applicable as an input power, and a driving circuit is simplified.

Embodiments of the invention are also directed to providing a highly efficient laser ignition device capable of preventing by-products, which are generated during the combustion of fuel, from adhering to a laser beam emission window.

Embodiments of the invention are also directed to providing a highly efficient laser ignition device capable of being stably operated by preventing the occurrence of incomplete ignition or ignition failure even when performing multi-focal focusing for multi-focal combustion required for combustion in a high capacity combustion chamber.

Embodiments of the invention are also directed to providing a highly efficient laser ignition device capable of blocking high temperature heat which is generated around an ignition point during an explosion stroke (expansion stroke) in an engine, and reversely moves toward the laser ignition device.

Technical Solution

One aspect of the embodiments of the present invention provides a highly efficient laser ignition device including: (a) a pumping light source including a multi-chip single emitter-packaged optical fiber output laser diode; (b) a laser medium to which ytterbium (Yb) is added; and (c) a saturable absorber used as a passive Q-switch medium, wherein a 100 to 999 picosecond pulse is obtained as a passive Q-switch laser output.

Here, the laser diode may have a wavelength band of 900 to 990 nm, and the saturable absorber may be a chromium-doped yttrium aluminium garnet (Cr:YAG) saturable absorber.

In addition, the highly efficient laser ignition device may also include a plurality of sets each including the components (a) to (c) and may further include a multi-focused ignition point generation unit at a next stage of the saturable absorber of each set.

Moreover, the above-described highly efficient laser ignition device may further preferably include a reverse flowing heat blocking unit.

Advantageous Effects

According to embodiments of the the present invention, there are effects as follows.

(1) A high efficiency laser, which is capable of outputting a several hundred picosecond pulse and passively Q-switched, is implemented by including a layer diode having a multichip single emitter packaging optical fiber output type, which is the latest technology, as a pumping light source and an ytterbium (Yb) added laser medium (for example, Yb-doped yttrium aluminium garnet (Yb:YAG)) and a saturable absorber, and is applied to a laser ignition device for engine ignition of an internal combustion engine and the like, and thus a low cost, small, and high efficient laser ignition system can be implemented.

(2) At this time, since a pulse repeat rate, which is two or three times the repeat rate required for ignition as a laser output, is used, pulses between ignition pulses can be used to automatically remove by-products which can adhere to a laser beam emission window, and thus a high efficient laser ignition system can be actually used.

(3) When a multi-focal focusing is performed for a multi-focal combustion required for combustion in a high capacity combustion chamber, since a laser pulse energy is transmitted using an optical fiber of which an emission cross section has an inclined surface instead of a simple high refractive index optical component, the laser pulse energy can be stably transmitted to an ignition point even when output directions of laser output pulses are finely changed and beam divergence angles are changed.

(4) Since high temperature heat, which is generated around an ignition point during an explosion stroke (expansion stroke) in an engine and reversely moves toward a laser ignition device, can be blocked, a highly efficient laser ignition device can be reliably operated.

BRIEF DESCRIPTION

Some of the embodiments will be described in detail, with reference to the following figures, wherein like designations denote like members, wherein:

FIG. 1 is a schematic configuration diagram illustrating a pumping light source used in a highly efficient laser ignition device according to embodiments of the the present invention used for ignition in an internal combustion engine of a vehicle or the like;

REFERENCE NUMERALS

10: MULTICHIP SINGLE EMITTER
12: FIRST FOCUSING LENS
14: PUMP FIBER INPUT
16: PUMP FIBER DELIVERY
18, 18-1, 18-2: PUMP FIBER OUTPUT
20: LASER DIODE OUTPUT LIGHT
22, 22-1, 22-2: SECOND FOCUSING LENS
24, 24-1, 24-2: YTTERBIUM ADDED LASER MEDIUM
24A: TOTAL REFLECTION COATING OF LASER MEDIUM
24B: ANTI-REFLECTIVE COATING OF LASER MEDIUM EMISSION SURFACE
26, 26-1, 26-2: SATURABLE ABSORBER
26A: ANTI-REFLECTIVE COATING OF SATURABLE ABSORBER
26B: OUTPUT GLASS COATING OF SATURABLE ABSORBER
28, 28-1, 28-2: THIRD FOCUSING LENS
30, 30-1, 30-2: INCIDENT WINDOW
30B: TOTAL REFLECTION COATING OF INCIDENT WINDOW FOR PREVENTING REVERSE MOVEMENT.
34: HEAT BLOCKING BLOCK
36, 36-1, 36-2: FOCUSED IGNITION POINT
42-1, 42-2: SIGNAL TRANSMISSION OPTICAL FIBER

DETAILED DESCRIPTION

Figure 1:
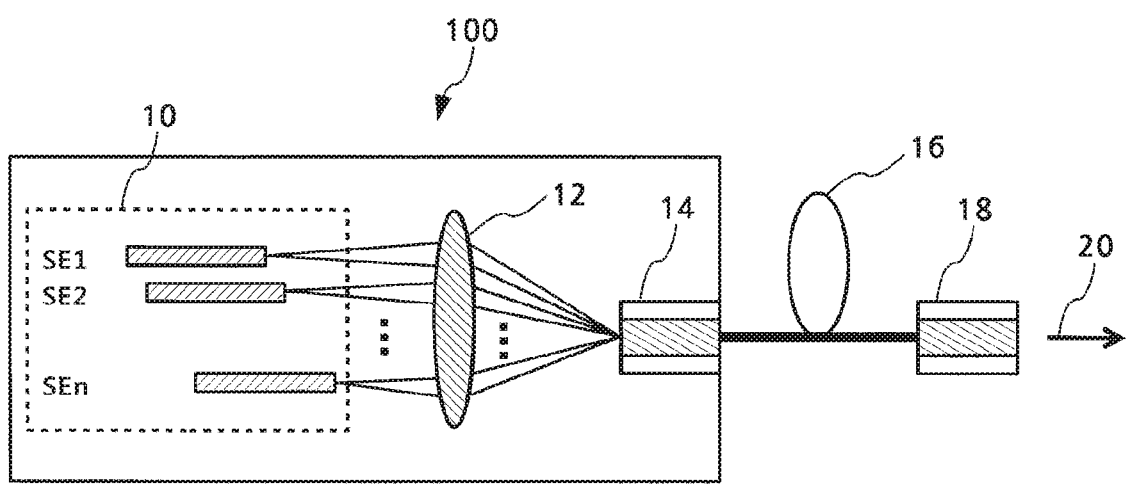

FIG. 1 is a schematic configuration diagram illustrating a pumping light source 100 used in a highly efficient laser ignition device according to embodiments of the the present invention used for ignition in an internal combustion engine of a vehicle or the like. Referring to FIG. 1, light emitted by a multichip single emitter 10 is focused by a first focusing lens 12 and input to a pump fiber input 14 in the pumping light source 100, and then the light is moved through a pump fiber delivery 16 and output through a pump fiber output 18 as laser diode output light 20. Although one lens is used as the first focusing lens 12 in FIG. 1, two or more lenses may be used thereas according to necessity. An suitable example of the pumping light source 100 illustrated in FIG. 1 is a multi-chip single emitter-packaged optical fiber output laser diode having a wavelength band of 900 to 990 nm, and has an advantage in that an entire highly efficient laser ignition device can be manufactured at low cost by realizing lower costs and smaller packaging compared to an 808 nm pumping laser diode of the conventional technology. The reason for such a pumping light source 100 being employed is that, since an upper-state lifetime of a Yb ion is 1,000 µs which is about six times longer than that of an Nd ion, a pumping pulse width may be as long as 1,200 to 2,000 µs when a ytterbium (Yb)-based laser medium rather than a neodymium (Nd)-based laser medium is used in the highly efficient laser ignition device, a pumping pulse energy in the range of 24 to 40 mJ per pulse may be input to a laser medium even when a 20 W pumping laser diode is used, and this will be described in detail below.

Figure 2:
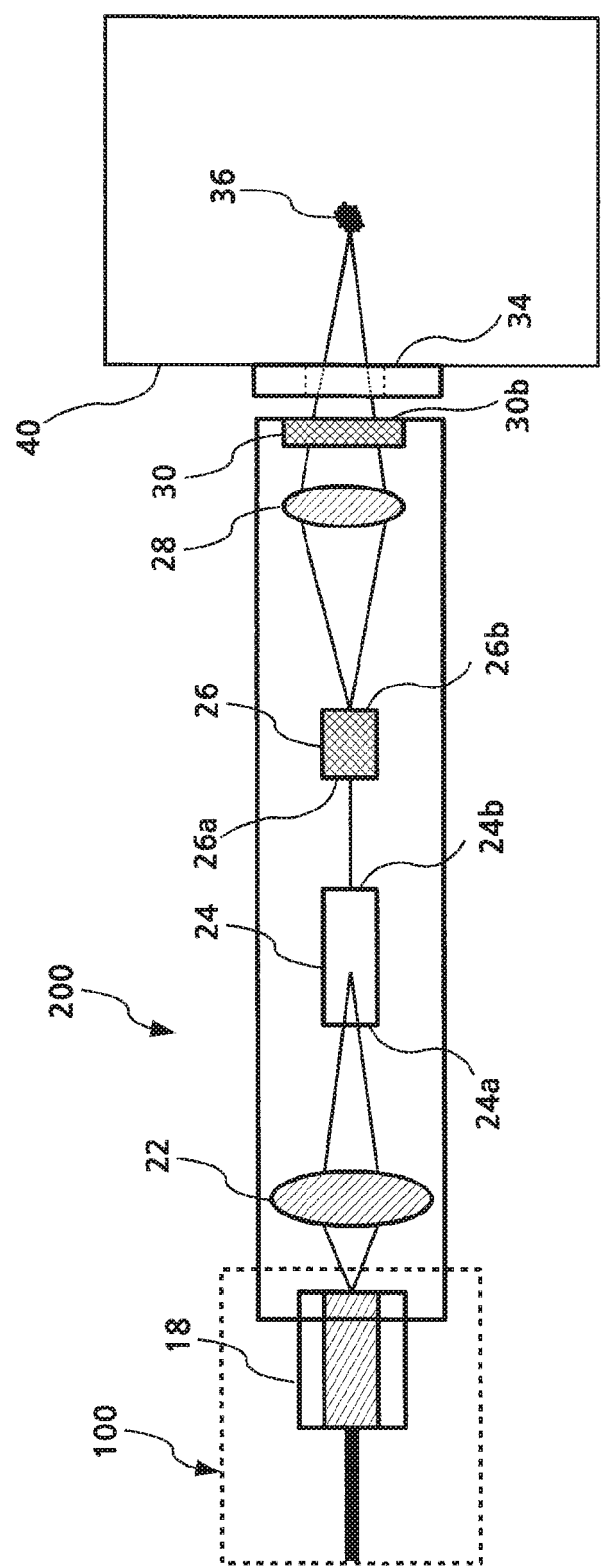
FIG. 2 is a schematic configuration diagram illustrating a highly efficient laser ignition device according to a first embodiment of the present invention.

FIG. 2 is a schematic configuration diagram illustrating a highly efficient laser ignition device 200 according to a first embodiment of the present invention. For convenience of illustration, in FIG. 2, only a pump fiber output 18 in the pumping light source 100 in FIG. 1 from which pumped light is output is illustrated, and the other components thereof are omitted. Referring to FIG. 2, the highly efficient laser ignition device 200 of embodiments of the the present invention employs a Yb added laser medium 24, such as Yb-doped yttrium aluminium garnet (Yb:YAG), as a component of a laser resonator. A short pulse of several hundred picoseconds is needed to obtain a high intensity laser beam required for ignition. In the highly efficient laser ignition device 200 of embodiments of the the present invention, a laser resonator includes a Yb added laser medium 24, in which a total reflection coating 24a for a 1030 nm wavelength band is applied on a pumping light incident surface side (pumping light is positioned on the left and proceeds from left to right) and an anti-reflective coating 24b for a 1030 nm wavelength band is applied on an emission surface side thereof, and a saturable absorber 26, which is a passive Q-switch medium, next to the Yb added laser medium 24. For example, a chromium-doped YAG (Cr:YAG) saturable absorber (for a 1030 nm wavelength band, the anti-reflective coating 26a is applied on a side of the laser medium and an output glass coating 26b is applied on the other side thereof) is disposed as an integrated type or separate types, and thus a several hundred picosecond pulse is obtained as the passive Q-switch laser output. At this time, when a length of the resonator needs to be adjusted, the output glass coating 26b may also be implemented by a separate output glass mirror. In FIG. 2, reference numerals 22 and 28 respectively denote a second focusing lens and a third focusing lens for focusing light, a reference numeral 30 denotes an incident window through which light output by the laser ignition device is transmitted into an engine, and a reference numeral 36 denotes an ignition point to which the light is focused by a third lens. Meanwhile, since there is a concern that high temperature heat generated around the ignition point during an explosion stroke (expansion stroke) in an engine reversely moves toward the laser ignition device 200 due to an emission spectrum, the following two reverse flowing heat blocking units are applied to prevent such a thermal transfer.

(1) A total reflection coating 30b for a wavelength in the range of 300 to 900 nm configured to prevent a reverse movement of an emission spectrum of an ignition fuel is applied on a right side surface of the incident window 30, through which light output by the last laser ignition device is transmitted into an engine, to block heat due to the emission spectrum of the ignition fuel or radiant heat.

(2) A heat blocking block 34, in which a zirconia-based ceramic having excellent thermal resistance, low thermal conductivity, and a thermal expansion rate similar to that of a metal at a high temperature or a similar ceramic thereto is used to prevent radiated heat from being transferred through a wall of an engine cylinder 40, is installed between a coupler positioned at a side of an engine cylinder of the laser ignition device and the engine cylinder, or is installed at a coupler positioned at the side of the engine cylinder of the laser ignition device in a single or separate type. In FIG. 2, the heat blocking block 34 is illustrated as blocking a light path because of being two-dimensionally illustrated, and since the heat blocking block 34 is manufactured and installed in a cylindrical type of which central portion is removed to prevent the light path from being interfered therewith, the heat blocking block 34 does not interfere with the light path.

Figure 3:
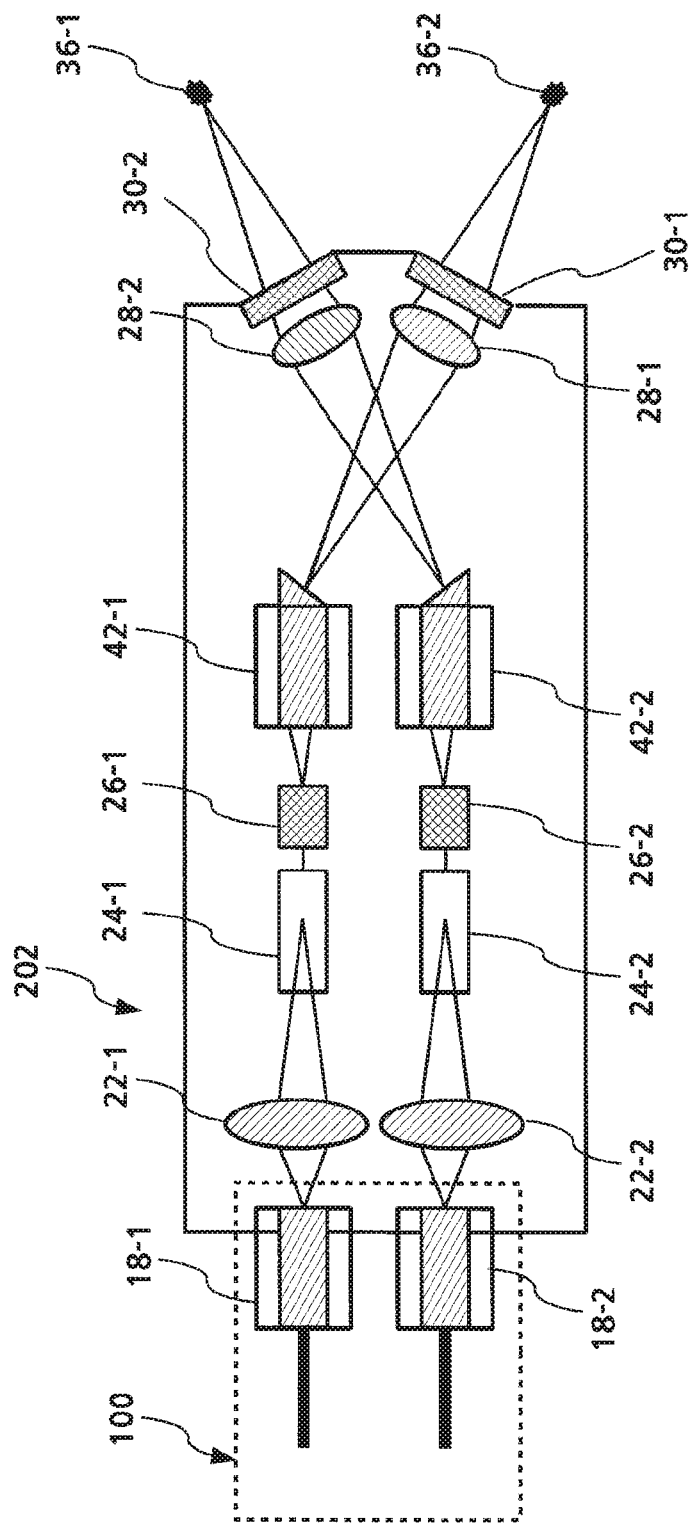
FIG. 3 is a schematic configuration diagram illustrating a highly efficient laser ignition device according to a second embodiment of the present invention.

FIG. 3 is a schematic configuration diagram illustrating a highly efficient laser ignition device 202 according to a second embodiment of the present invention. A feature of the second embodiment compared with the first embodiment includes individual sets which are pump fiber outputs 18-1 and 18-2 included in a pumping light source 100 including a multi-chip single emitter-packaged optical fiber output laser diode, Yb added laser mediums 24-1 and 24-2, saturable absorbers 26-1 and 26-2 as passive Q-switch mediums, second focusing lenses 22-1 and 22-2 according thereto, and third focusing lenses 28-1 and 28-2. Since each of the sets generates one focused ignition point in an engine, a plurality of sets finally generate multi-focused ignition points 36-1 and 36-2, and thus simultaneous multi-focal and multi-ignition which is an advantageous in high capacity combustion can be performed. Another feature of the second embodiment is that signal transmission optical fibers 42-1 and 42-2 of which incident cross sections have angles of 90° to the direction of incident light and emission cross sections are inclined are installed between the saturable absorbers 26-1 and 26-2 and the third focusing lenses 28-1 and 28-2 as multi-focused ignition point generation units instead of a simple high refractive index optical component, and thus laser pulse energy may be stably transmitted to ignition points even when output directions of laser output pulses are finely changed or beam divergence angles are changed. For convenience of illustration, a total reflection coating layer, an anti-reflective coating layer, and the like, which are included in components, are not illustrated in FIG. 3, but coating layers are added thereto similarly as in FIG. 2, and thus a highly efficient laser ignition device is suitably operated. The same components in the first embodiment and the second embodiment serve the same roles, one of the laser mediums 24-1 and 24-2 to which Yb is added is used in the first embodiment, and both of the laser mediums 24-1 and 24-2 are used in the second embodiment, but one of the laser mediums 24-1 and 24-2 may also be commonly used in the second embodiment as long as there is no problem with laser output. In addition, design and manufacture thereof can be expanded to three or four sets, and it may also have more advantages when implemented.

As described above, the highly efficient laser ignition device according to the embodiment of the present invention has operational features and advantages as follows.

(1) Low cost 900 to 990 nm pumping laser diodes can be used. (2) Since an upper-state lifetime of Yb is 1000 µs, a pumping pulse width is as long as about 2000 µs at maximum, and thus the maximum usable pumping pulse energy is increased and the highly efficient laser ignition device is efficient. (3) Since the peak power of a pumping laser diode is low, a low current is used as input power, and thus a driving circuit becomes simple. (4) Accordingly, there is an advantage in that a total system is inexpensive and can be actually applied. (5) In addition, since a repeat rate, which is two or three times a repeat rate required as a laser output for ignition, is used, pulses between ignition pulses are used to automatically remove combustion by-products which may adhere to a laser beam emission window, the highly efficient laser ignition device has an advantage in that actual application becomes possible. When an amount of adsorbed by-product is increased, laser beams are absorbed by the by-products, laser energy transmitted to a focal point, which is an ignition point, is decreased, ignition may become unstable or impossible, and thus such automatic removal is particularly effective. (6) In addition, when multi-focal focusing is performed for multi-focal combustion which is required to be used for combustion of a high capacity combustion chamber, an optical fiber having an inclined emission cross section is used to transmit light instead of a simple high refractive index optical component, and thus there is an advantage in that even when output directions of laser output pulses are finely changed and beam divergence angles are changed, laser pulse energy can be transmitted to an ignition point. (7) In addition, since a window coating to which an emission spectrum total reflection coating is applied and a heat blocking block designed to prevent interference with a light path are used, there is an advantage in than reverse movement of radiant heat due to an ignition fuel emission spectrum and thermal transfer though an inner wall of an engine cylinder are prevented.

INDUSTRIAL APPLICABILITY

Since embodiments of the present invention solves the problems of high cost/low efficiency/low reliability/non-uniformity which are disadvantages arising from the replacement of an ignition device using an electric spark with a laser ignition device, embodiments of the the present invention has high industrial applicability in the field of ignition devices.

The invention claimed is:

1. A laser ignition device comprising:
   (a) a pumping light source including a multi-chip single emitter-packaged optical fiber output laser diode using a first focusing lens and a fiber to combine an output power of multiple single-emitters, the first focusing lens focuses light emitted by multichip single emitters, and the fiber to gather the multiple laser outputs from the first focusing lens;
   (b) a laser medium to which ytterbium (Yb) is added; and
   (c) a saturable absorber used as a passive Q-switch medium,
   wherein a 100 to 999 picosecond pulse is obtained as an output of the saturable absorber;
   wherein the pumping light source has a wavelength band of 900 to 990 nm,
   wherein the pumping light source is operated at a pumping pulse width between 1,200 to 2,000 µs.

2. The laser ignition device of claim 1, wherein:
   the saturable absorber includes a chromium-doped yttrium aluminium garnet (Cr:YAG) saturable absorber.

3. The laser ignition device of claim 1, comprising a plurality of sets each including the components (a) to (c), and further comprising a multi-focused ignition point generation unit at a next stage of the saturable absorber of each set.

4. The laser ignition device of claim 1, further comprising a reverse flowing heat blocking unit.

* * * * *